United States Patent
Baringhaus et al.

(10) Patent No.: US 12,211,939 B2
(45) Date of Patent: Jan. 28, 2025

(54) VERTICAL FIELD-EFFECT TRANSISTOR AND METHOD FOR FORMING SAME

(71) Applicant: Robert Bosch GmbH, Stuttgart (DE)

(72) Inventors: Jens Baringhaus, Sindelfingen (DE); Daniel Krebs, Aufhausen (DE); Dick Scholten, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 69 days.

(21) Appl. No.: 17/766,319

(22) PCT Filed: Sep. 21, 2020

(86) PCT No.: PCT/EP2020/076286
§ 371 (c)(1),
(2) Date: Apr. 4, 2022

(87) PCT Pub. No.: WO2021/078450
PCT Pub. Date: Apr. 29, 2021

(65) Prior Publication Data
US 2024/0055528 A1 Feb. 15, 2024

(30) Foreign Application Priority Data
Oct. 21, 2019 (DE) .................. 10 2019 216 142.1

(51) Int. Cl.
*H01L 29/76* (2006.01)
*H01L 29/417* (2006.01)
(Continued)

(52) U.S. Cl.
CPC .... *H01L 29/7856* (2013.01); *H01L 29/41791* (2013.01); *H01L 29/66795* (2013.01)

(58) Field of Classification Search
CPC ......... H01L 29/7856; H01L 29/417912; H01L 29/66795; H01L 29/7802; H01L 29/1608;
(Continued)

(56) References Cited

U.S. PATENT DOCUMENTS

| 5,917,216 A | 6/1999 | Floyd et al. |
| 2013/0043468 A1* | 2/2013 | Adekore ............. H01L 29/7788 257/43 |

FOREIGN PATENT DOCUMENTS

| EP | 0726603 A2 | 8/1996 |
| JP | 2006086548 A | 3/2006 |

(Continued)

OTHER PUBLICATIONS

International Search Report for PCT/EP2020/076286, Issued Dec. 2, 2020.

*Primary Examiner* — Niki H Nguyen
(74) *Attorney, Agent, or Firm* — NORTON ROSE FULBRIGHT US LLP; Gerard A. Messina

(57) ABSTRACT

A vertical field-effect transistor. The transistor includes: a drift region having a first conductivity type; a semiconductor fin on or over the drift region; and a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being set up to limit a conductive channel of the vertical field-effect transistor in the semiconductor fin to the area of the electrically conductive region.

11 Claims, 9 Drawing Sheets

(51) Int. Cl.
*H01L 29/66* (2006.01)
*H01L 29/78* (2006.01)

(58) Field of Classification Search
CPC ........... H01L 29/7816; H01L 29/41766; H01L 29/66068; H01L 29/7827; H01L 29/66666; H01L 29/66712; H01L 29/4175; H01L 29/66681; H01L 29/66477; H01L 29/7395; H01L 29/8083; H01L 29/78642; H01L 29/78696; H01L 29/7722; H01L 29/0696; H01L 29/1095
See application file for complete search history.

(56) References Cited

FOREIGN PATENT DOCUMENTS

| | | | |
|---|---|---|---|
| JP | 2008306095 | A | 12/2008 |
| WO | 2008108299 | A1 | 9/2008 |
| WO | 2019103698 | A1 | 5/2019 |

\* cited by examiner

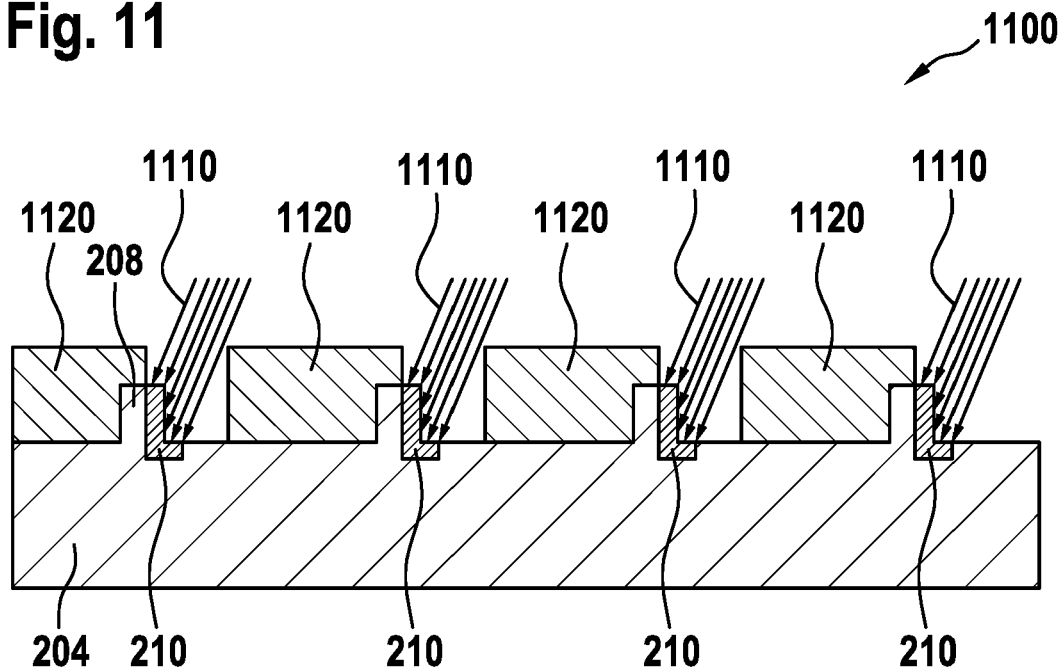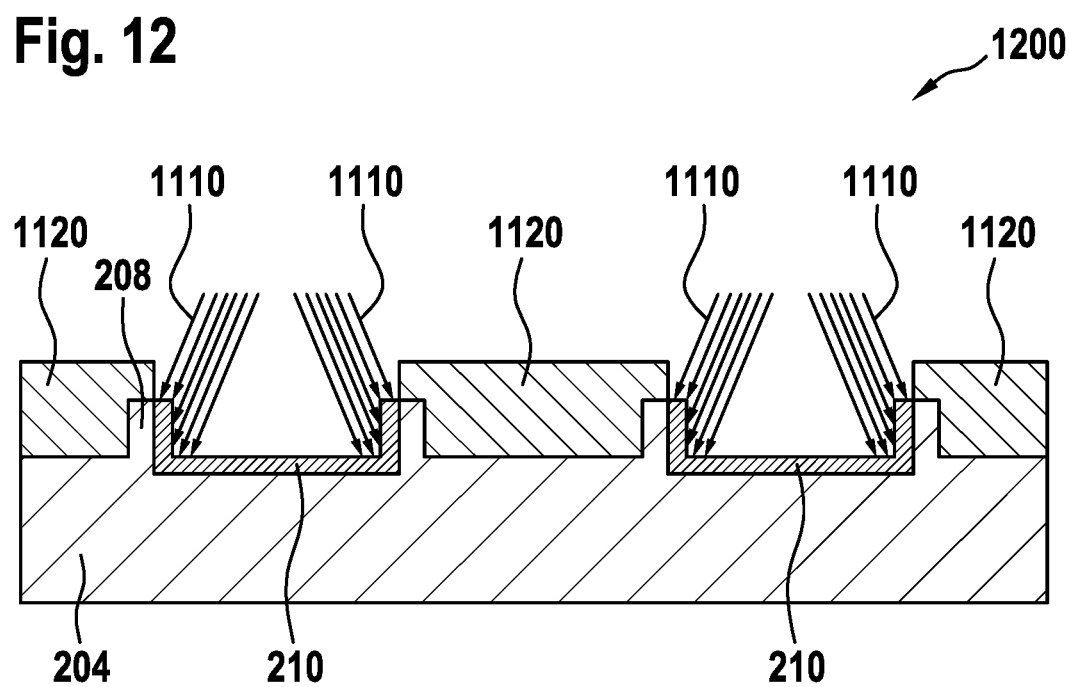

VERTICAL FIELD-EFFECT TRANSISTOR AND METHOD FOR FORMING SAME

FIELD

The present invention relates to a vertical field-effect transistor, and to a method for forming said transistor.

BACKGROUND INFORMATION

In conventional transistors (for example MOSFETs or MISFETs), the active switchable component is provided by an inversion channel, for example by the p-region in an npn transition, in which an electron path is formed by applying a gate voltage. For the use of semiconductors having a wide bandgap (for example silicon carbide (SiC) or gallium nitride (GaN)) in the power electronics stage, the use of so-called power FinFETs can be advantageous. The structure of a conventional power FinFET 100 is illustrated in FIG. 1. The conventional power FinFET 100 has, on a substrate 102, a drift region 104 having an n– doping, a drain electrode 106, a source electrode 108, a gate electrode 110, a semiconductor fin 112, a gate dielectric 114, and an insulator 116. Semiconductor fin 112 is connected to source electrode 108 by an n+ doping 118. In the power FinFET 100, the switchable component is made up of narrow semiconductor fin 112, which is switchable due to its geometry and the suitable selection of the gate metallization 110. The channel resistance of power FinFET 100 is significantly lower than in a conventional MOSFET or MISFET based on SiC or GaN. This results in a lower switch-on resistance of the overall component. In its previous form, the power FinFET 100 required the provision of a narrow semiconductor fin whose lateral width determines the switch-on voltage of the transistor. In order to achieve a positive switch-on voltage (threshold voltage) (so-called normally-off transistor), which is typically required in particular in safety-relevant applications, a width of the semiconductor fin of from a few 100 nm to smaller than 100 nm is required. The width of the semiconductor fin is a function in particular of the semiconductor material that is used of the semiconductor fin, as well as of the work function of the gate metal. Such narrow semiconductor fins can no longer be producible for conventional photolithography, as is typically used in the series production of power transistors.

SUMMARY

An object of the present invention is to provide a vertical field-effect transistor, as well as a method for producing it, that enables a vertical field-effect transistor having a positive switch-on voltage even with wider semiconductor fins.

According to an aspect of the present invention, the object is achieved by a vertical field-effect transistor. In accordance with an example embodiment of the present invention, the vertical field-effect transistor has: a drift region having a first conductivity type; a semiconductor fin on or over the drift region; and a source/drain electrode on or over the semiconductor fin, the semiconductor fin having an electrically conductive region that connects the source-drain electrode in electrically conductive fashion to the drift region, and a limiting structure that is formed laterally to the electrically conductive region and extends from the source/drain electrode to the drift region, the limiting structure being set up to limit a conductive channel of the vertical field-effect transistor in the semiconductor fin to the area of the electrically conductive region. This enables a vertical field-effect transistor having a structurally wider semiconductor fin having a positive switch-on voltage (threshold voltage). The positive threshold voltage is achieved through the relatively narrow electrically conductive semiconductor fin. Here, what is decisive is not the structural width of the semiconductor fin, but rather the width of the electrically conductive region of the semiconductor fin. An increase in the threshold voltage can correspondingly also be achieved in a wider semiconductor fin if a part of the width of the semiconductor fin is electrically non-conductive. For example, the limiting structure can be realized in the form of a p-doped region in a part of the semiconductor fin, the p-doped region acting as an electrically non-conductive region in the fin during operation of the transistor. The width of the semiconductor fin, which determines the threshold voltage, is given by the width of the region of the semiconductor fin that remains electrically conductive.

According to a further aspect of the present invention, the object may be achieved by a method for forming a vertical field-effect transistor. In accordance with an example embodiment of the present invention, the method includes: forming a drift region having a first conductivity type; forming a semiconductor fin on or over the drift region; and forming a source/drain electrode on or over the semiconductor fin, the semiconductor fin having an electrically conductive region that connects the source/drain electrode in electrically conductive fashion to the drift region and a limiting structure that is formed laterally next to the electrically conductive region and extends from the source/drain electrode to the drift region, the limiting structure being set up to limit a conductive channel of the vertical field-effect transistor in the semiconductor fin to the area of the electrically conductive region. This makes it possible to reduce the lithographic requirements on the structuring, or the structural width of the semiconductor fin.

Developments of the aspects of the present invention are presented in the description herein. Specific embodiments of the present invention are shown in the Figures and are explained in more detail below.

BRIEF DESCRIPTION OF THE DRAWINGS

FIG. 11 shows a schematic sectional representation of a vertical field-effect transistor during the forming thereof, according to various specific embodiments of the present invention.

FIG. 12 shows a schematic sectional representation of a vertical field-effect transistor during the forming thereof, according to various specific embodiments of the present invention.

DETAILED DESCRIPTION OF EXAMPLE EMBODIMENTS

Figure 1:
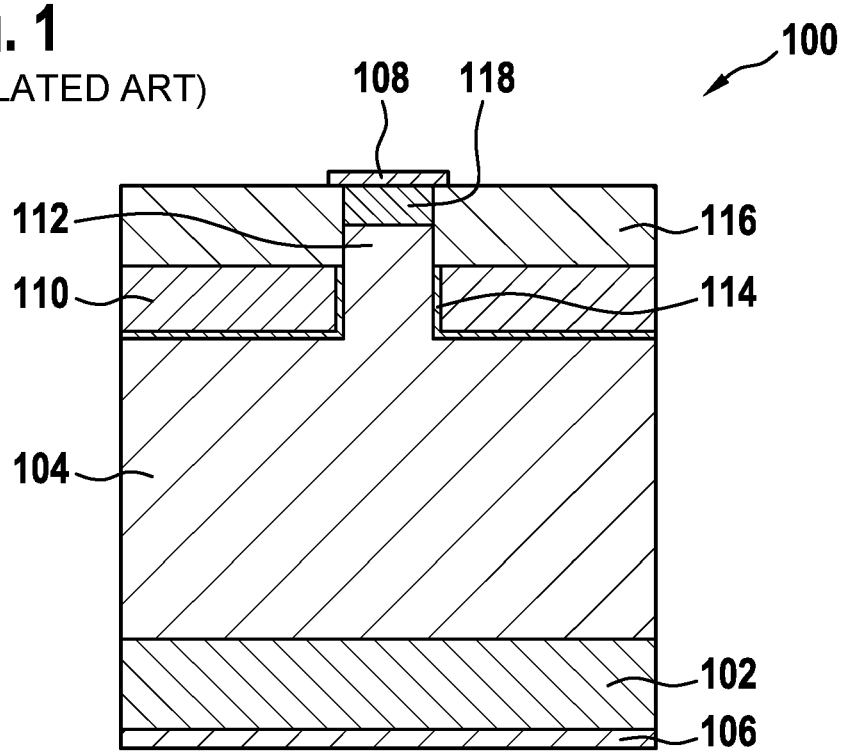
FIG. 1 shows a schematic sectional representation of a transistor structure of the related technology (related art).
Figure 2:
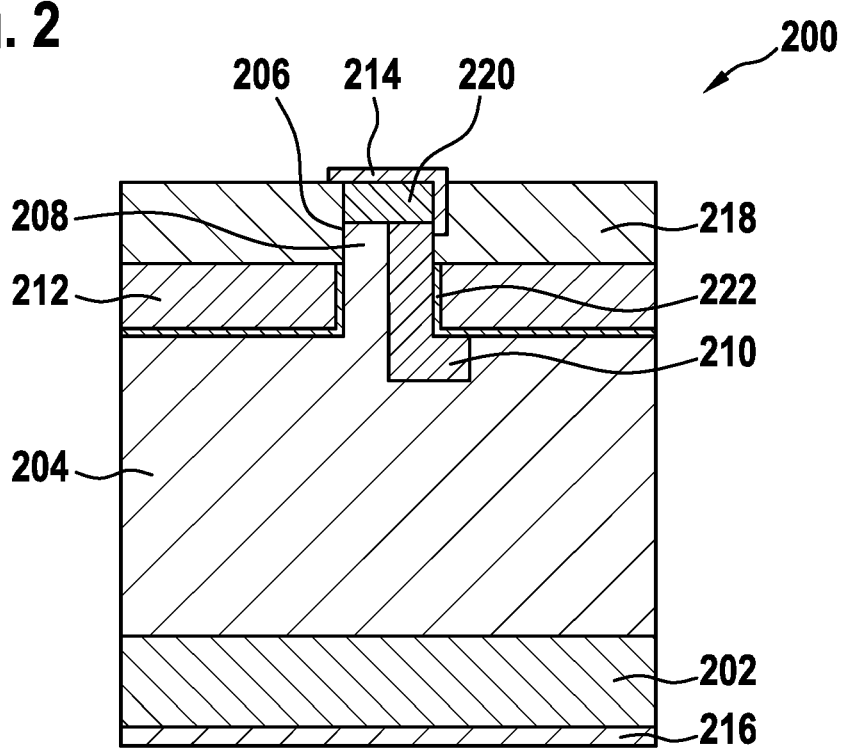
FIG. 2 shows a schematic sectional representation of a vertical field-effect transistor according to various specific embodiments of the present invention.
Figure 3:
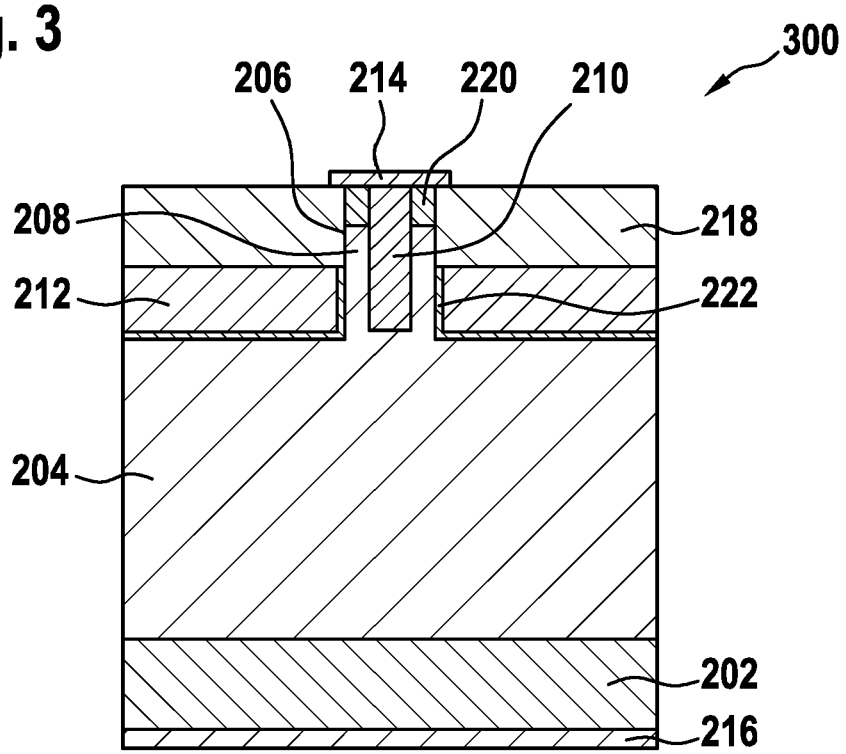
FIG. 3 shows a schematic sectional representation of a vertical field-effect transistor according to various specific embodiments of the present invention.

In the following detailed description, reference is made to the figures, which form part of the present description and in which, for the purpose of illustration, specific exemplary embodiments are shown in which the present invention can be realized. It will be understood that other exemplary embodiments may be used, and structural or logical changes may be made, without departing from the scope of protection of the present invention. It will be understood that the features of the various exemplary embodiments described herein can be combined with one another, unless specifically stated otherwise. The following detailed description is therefore not to be understood in a limiting sense.

In the Figures, identical or similar elements are provided with identical reference characters, where useful.

FIG. 2 through FIG. 9 show schematic views of a vertical field-effect transistor according to various specific embodiments. In various specific embodiments, a vertical field-effect transistor 200, 300, 400, 500, 600, 700 has a drift region 204 on a semiconductor substrate 202; a semiconductor fin 206 (whose longitudinal direction runs perpendicular to the plane of the drawing) on or over drift region 204, a limiting structure 210, a first source/drain electrode (e.g., a source electrode 214), and a second source/drain electrode (e.g., a drain electrode 216). In the following, it is assumed as an example that the first source/drain electrode 214 is a source electrode, and that the second source/drain electrode 216 is a drain electrode. In addition, vertical field-effect transistor 200 has a gate electrode 212 next to at least one side wall of semiconductor fin 206, gate electrode 212 being electrically insulated from source electrode 214 by an insulation 218. A gate dielectric 222 is situated between gate electrode 212 and semiconductor fin 206. A highly doped connecting area 220 can connect semiconductor fin 206 to source electrode 214 in electrically conductive fashion. In addition, source electrode 214 can be formed laterally next to at least one side wall of semiconductor fin 206, on or over drift region 204.

Semiconductor fin 206 has the limiting structure 210 next to an electrically conductive region 208. Limiting structure 210 laterally limits the electrical and structural extension of electrically conductive region 208. Electrically conductive region 208 has the first conductivity type, and the limiting structure 210 has a second conductivity type differing from the first conductivity type. In other words: vertical field-effect transistor 200, 300, 400, 500, 600, 700 can have a drift region 204 having a first conductivity type; a semiconductor fin 206 on or over drift region 204; and a source electrode 214 or drain electrode 216 on or over semiconductor fin 206. Semiconductor fin 206 has an electrically conductive region 208 that connects source electrode 214, or drain electrode 216, to drift region 204 in electrically conductive fashion, and in addition has a limiting structure 210 that is formed laterally next to electrically conductive region 208 and that extends from source electrode 214, or drain electrode 216, to drift region 204. Limiting structure 210 is set up to limit a conductive channel of the vertical field-effect transistor in semiconductor fin 206 to the area of the electrically conductive region 208. The limiting structure can reduce the lateral extension of the conductive region inside the semiconductor fins. The conductive region is more strongly depleted, and the threshold voltage of the vertical field-effect transistor is increased. In addition, in various specific embodiments the limiting structure can be set up to shield the semiconductor fin and in particular the gate oxide against field peaks. This can increase the blocking strength and reliability of the vertical field-effect transistor.

Semiconductor substrate 202 can be for example a GaN substrate 202 or an SiC substrate 202. The weakly n-conductive semiconductor drift region 204 (also designated drift zone 204), for example a GaN drift region 204 or a SiC drift region 204, can be formed (e.g., applied) on semiconductor substrate 202. Above drift region 204, there can be formed an n-conductive semiconductor area in the form of semiconductor fin 206, for example in the form of a GaN or SiC fin 206. On semiconductor fin 206, or in an upper subregion of fin 206, there can be formed an n+ conductive connection area 220 by which source electrode 214 is contacted to semiconductor fin 206. Source electrode 214 can contact both limiting structure 210 and semiconductor fin 206. Drain electrode 216 can be situated on the rear side of substrate 202. During operation, a space charge region can be formed between the areas of limiting structure 210 and drift region 204. In this way, the region in which a current can flow can be reduced, and the resistance can be increased thereby. Through the introduction of limiting structure 210, the overall resistance of field-effect transistor 200, 300, 400, 500, 600, 700 is increased compared to the variant not having a limiting structure (FIG. 1). The potential at drain electrode 216 in the blocking case results in an electrical field that has its maximum directly below limiting structure 210 and not, as is the case without limiting structure 210 (see FIG. 1), in the vicinity of the base of semiconductor fin 206. This prevents for example a premature electrical breakdown of the field-effect transistor, or a punch-through of the voltage applied to drain electrode 216 to gate electrode 212. In the region adjacent to gate electrode 212, semiconductor fin 208 is depleted. Without the application of a gate voltage, the field-effect transistor can be self-blocking, because the electron gas below semiconductor fin 206, in the drift region, can be depleted. Through application of a positive voltage to gate electrode 210, electrodes can accumulate in the region of semiconductor fin 208, which is adjacent to gate electrode 212. The electrodes can flow from source electrode 214 through semiconductor fin 206 into the base of semiconductor fin 206, and from there can move through drift region 204 and through substrate 202 into drain electrode 216.

Limiting structure 210 can extend into drift region 204. In other words, limiting structure 210 can have a region situated in drift region 204 that extends laterally in the direction of gate electrode 212, as is illustrated for example in FIG. 2. In the drift region, limiting structure 210 can act as a shielding structure that reduces field peaks of the electrical field below or in the vicinity of gate electrode 212, or shifts them into drift region 204, for example in comparison with a field-effect transistor not having a shielding structure.

Limiting structure 210 can be laterally surrounded completely by electrically conductive region 208. Limiting structure 210 and the electrically conductive region can be formed in coaxial fashion, as is illustrated for example in FIG. 3. Alternatively, limiting structure 210 can be formed on at least one side wall of semiconductor fin 206, as is illustrated for example in FIG. 2, FIG. 6, and FIG. 7.

Figure 4:
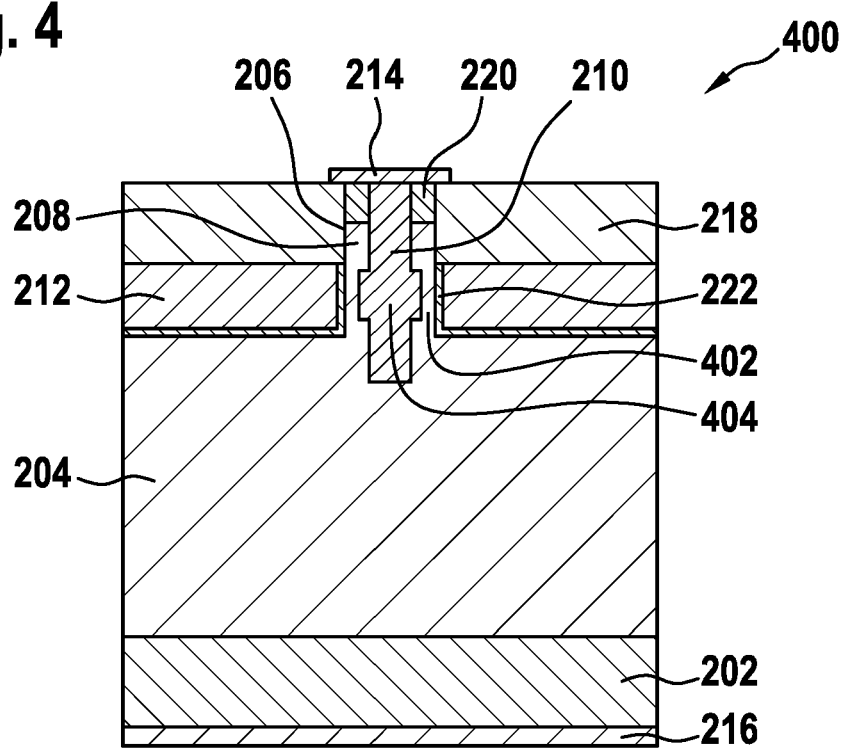
FIG. 4 shows a schematic sectional representation of a vertical field-effect transistor according to various specific embodiments of the present invention.
Figure 5:
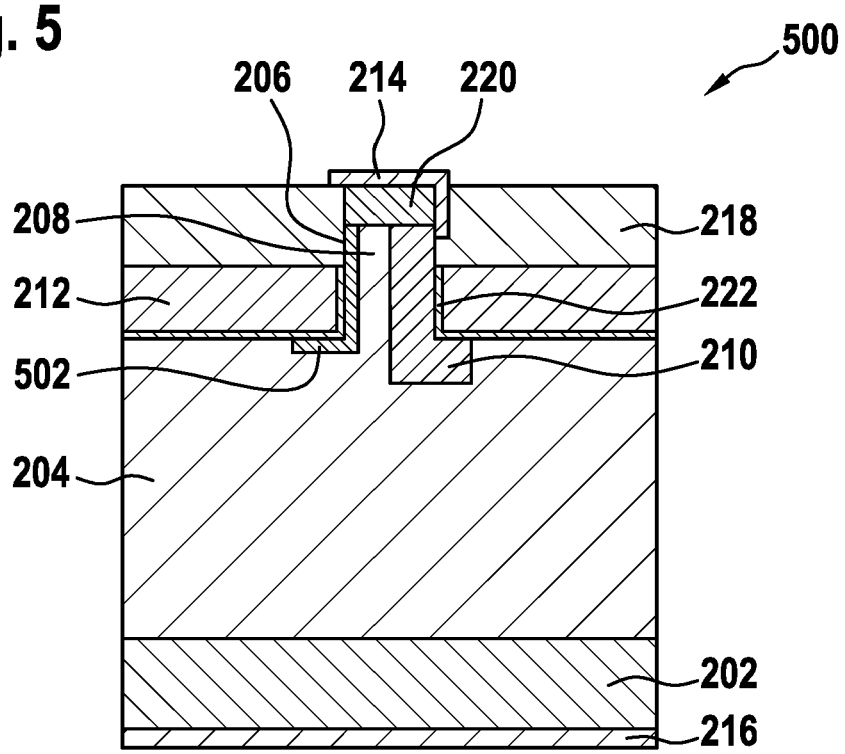
FIG. 5 shows a schematic sectional representation of a vertical field-effect transistor according to various specific embodiments of the present invention.
Figure 6:
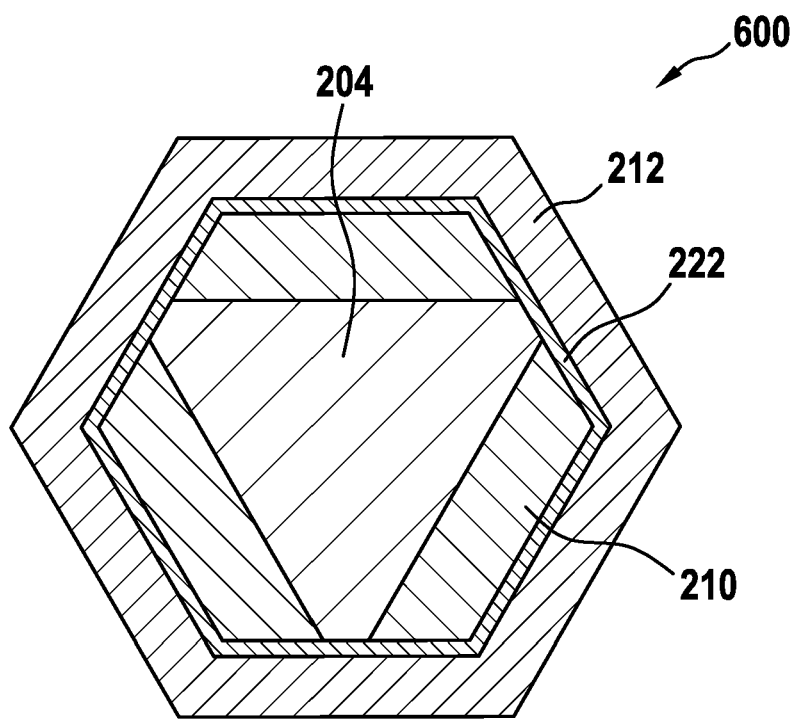
FIG. 6 shows a schematic view of a vertical field-effect transistor according to various specific embodiments of the present invention.
Figure 7:
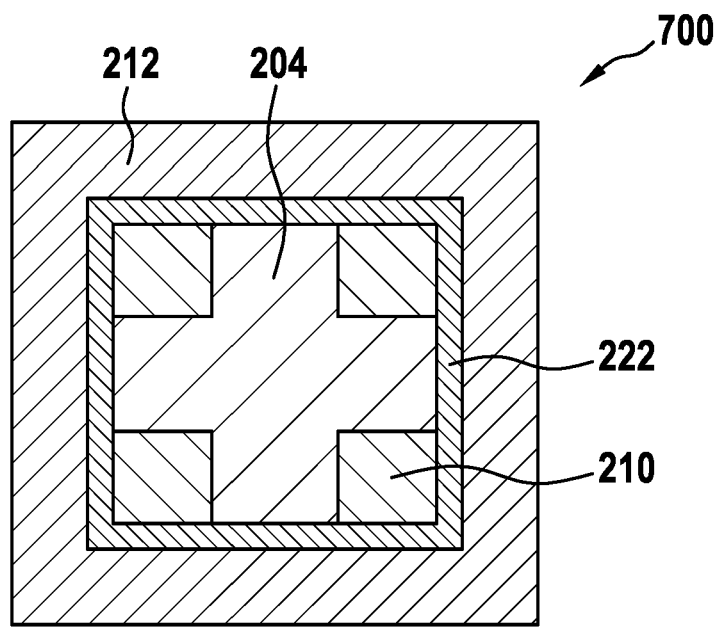
FIG. 7 shows a schematic view of a vertical field-effect transistor according to various specific embodiments of the present invention.

In a first segment 404, situated laterally next to gate electrode 212, limiting structure 210 can have a larger lateral extension than in a second segment, so that the electrically conductive region has a narrowed segment 402 in a region of semiconductor fin 206 corresponding to first segment 404 of limiting structure 210, as is illustrated for example in FIG. 4.

The first and the second conductivity type can be opposite conductivity types. Drift region 204 can for example be n-conductive, and limiting structure 210 can have at least one p-conductive region. Alternatively or in addition, limiting structure 210 can have a second limiting structure 502 that is electrically non-conductive, as illustrated for example in FIG. 5.

Figure 8:
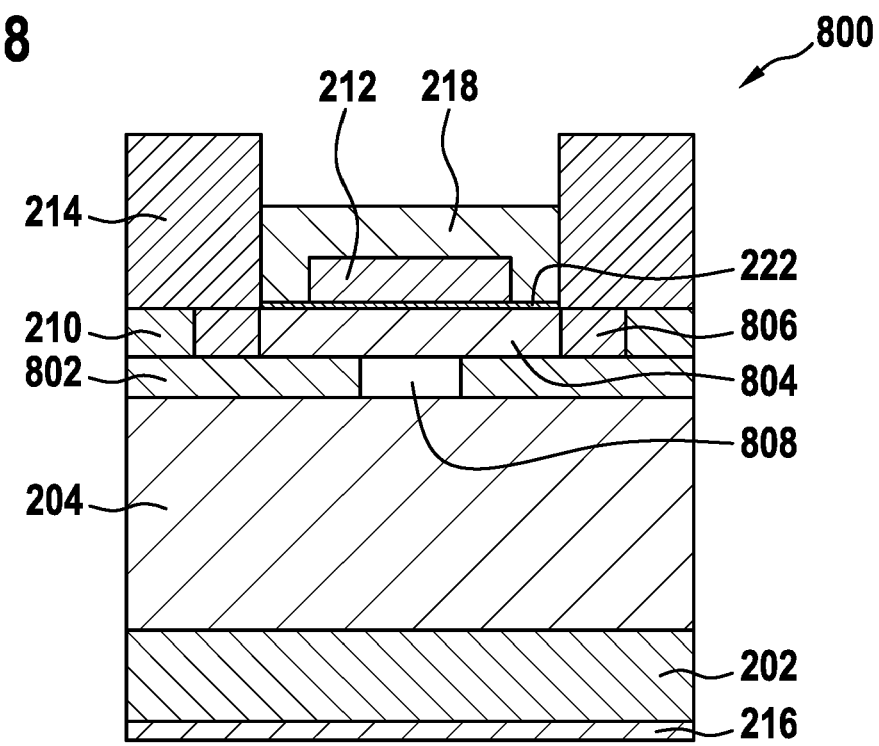
FIG. 8 shows a schematic sectional representation of a vertical field-effect transistor according to various specific embodiments of the present invention.
Figure 9:
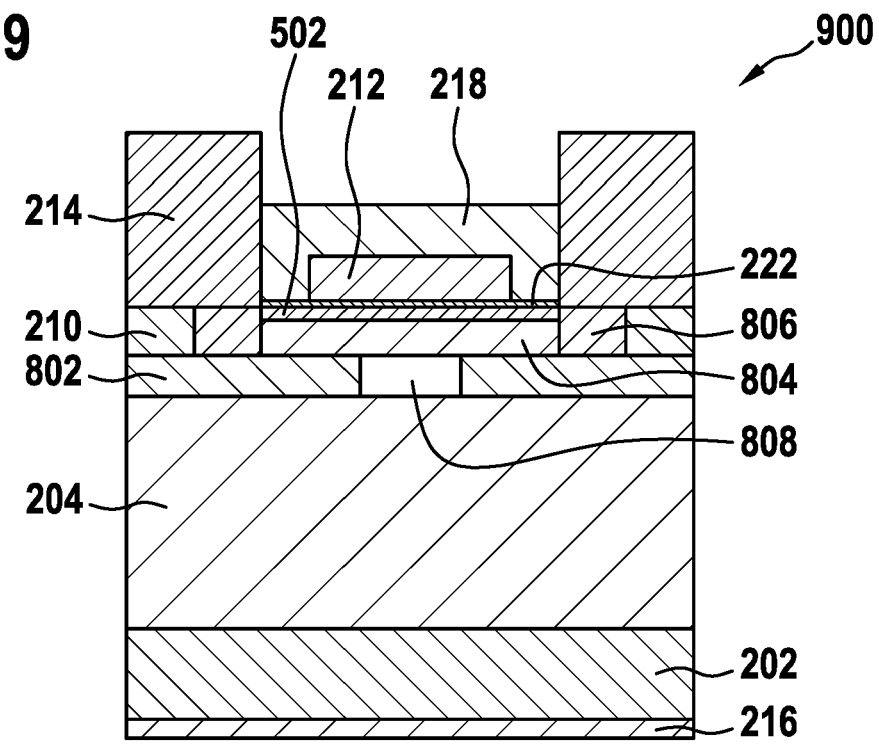
FIG. 9 shows a schematic sectional representation of a vertical field-effect transistor according to various specific embodiments of the present invention.

In various specific embodiments, the flow of current in the semiconductor fin can also take place partly in the horizontal direction, as illustrated in FIG. 8 and FIG. 9. For this purpose, additional layers or structures of the first or second conductivity type can be provided that spatially limit the flow of current. For example, electrically conductive regions 804, 806, 808 of the first conductivity type can be provided in fin 206, and in addition to regions 210 the limiting structure can have further layers or structures 802 that limit the flow of current. A flow of current takes place for example from source electrode 214 through regions 806, 804, 808, through drift region 204 and substrate 202, to drain electrode 216. The vertical limiting of the current path takes place through region 802 of the second conductivity type. This specific embodiment can be combined with features of the specific embodiments further described above, as is illustrated for example in FIG. 9, which shows an additional limiting structure 502 on the upper side of the fin.

In addition, in various specific embodiments limiting structure 210 can be set up to provide a body diode via the pn transition connected to the source electrode. For example, in various specific embodiments the electrically conductive region 208 of semiconductor fin 206 is n-doped, and limiting structure 210 is p-doped or non-conductive. A non-conductive limiting structure 210 can be formed for example by counter-doping or by introducing a non-active ion species (for example argon). In specific embodiments having a non-conductive limiting structure, a body diode is not realized, because the limiting structure is not conductive.

Figure 10:
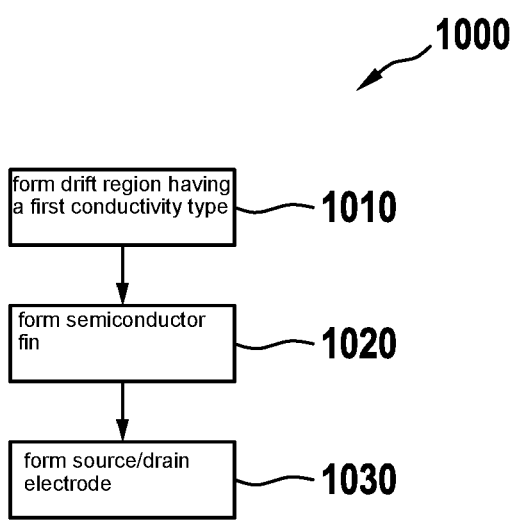
FIG. 10 shows a flow diagram of a method for forming a vertical field-effect transistor according to various specific embodiments of the present invention.

FIG. 10 shows a flow diagram of a method for forming a vertical field-effect transistor according to various specific embodiments. Method 1000 includes a forming 1010 of a drift region 204 having a first conductivity type; a forming 1020 of the semiconductor fin 206 on or over drift region 204; and a forming 1030 of a source/drain electrode 214, 216 on or over semiconductor fin 206. Semiconductor fin 206 has an electrically conductive region 208 that connects source/drain electrode 214, 216 to drift region 204 in electrically conductive fashion, and has a limiting structure 210 that is formed laterally next to electrically conductive region 208 and that extends from source/drain electrode 214, 216 to drift region 204. Limiting structure 210 is set up to limit a conductive channel of the vertical field-effect transistor in semiconductor fin 206 to the area of the electrically conductive region 208.

All the specific embodiments shown can also be realized having a non-conductive limiting structure 210.

Figure 13A:
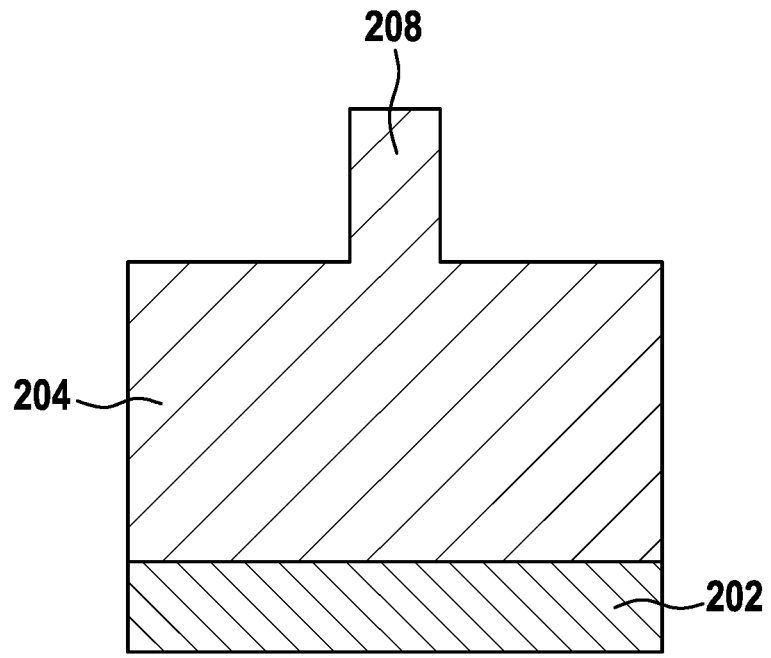
FIG. 13A-F shows schematic sectional representations of a vertical field-effect transistor during the forming thereof, according to various specific embodiments of the present invention.
Figure 13B:
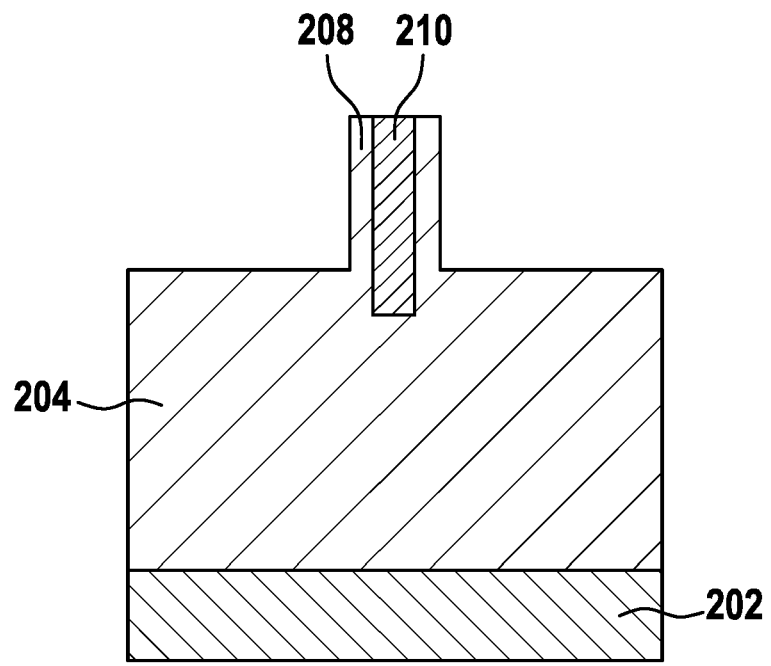
Figure 13C:
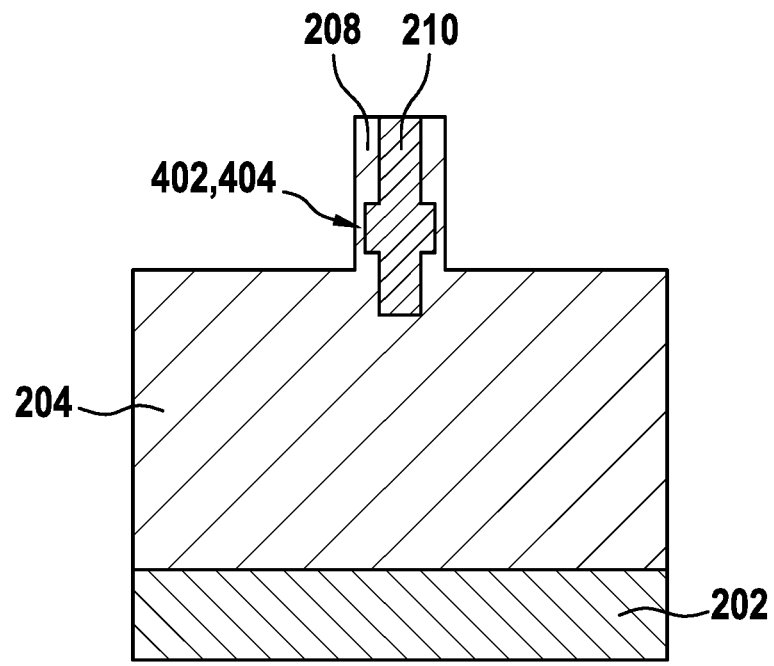
Figure 13D:
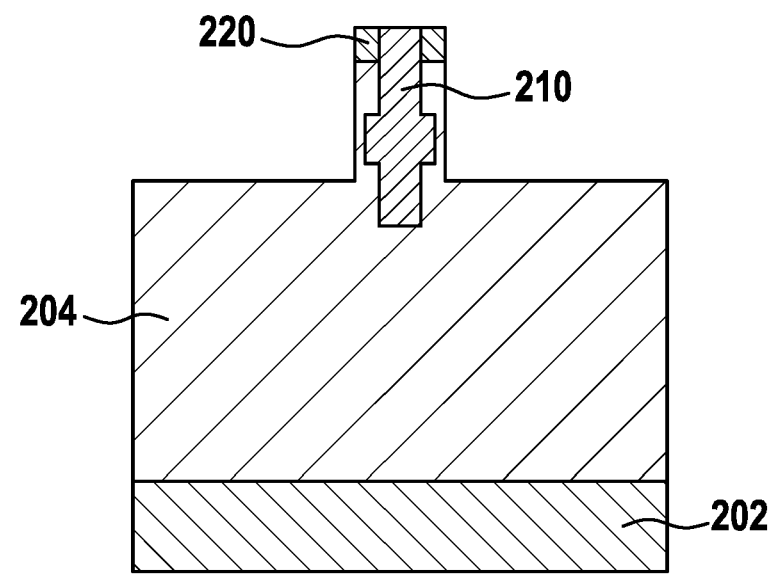
Figure 13E:
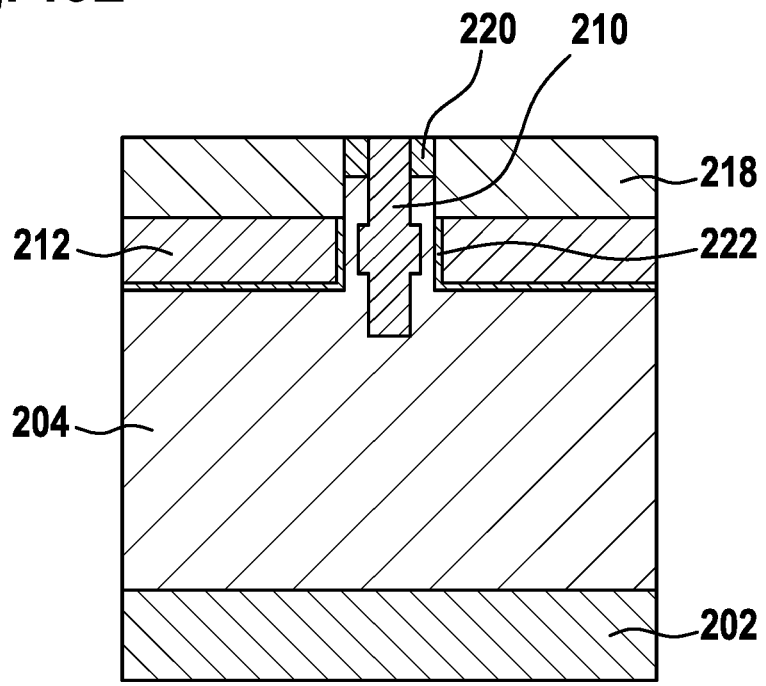
Figure 13F:
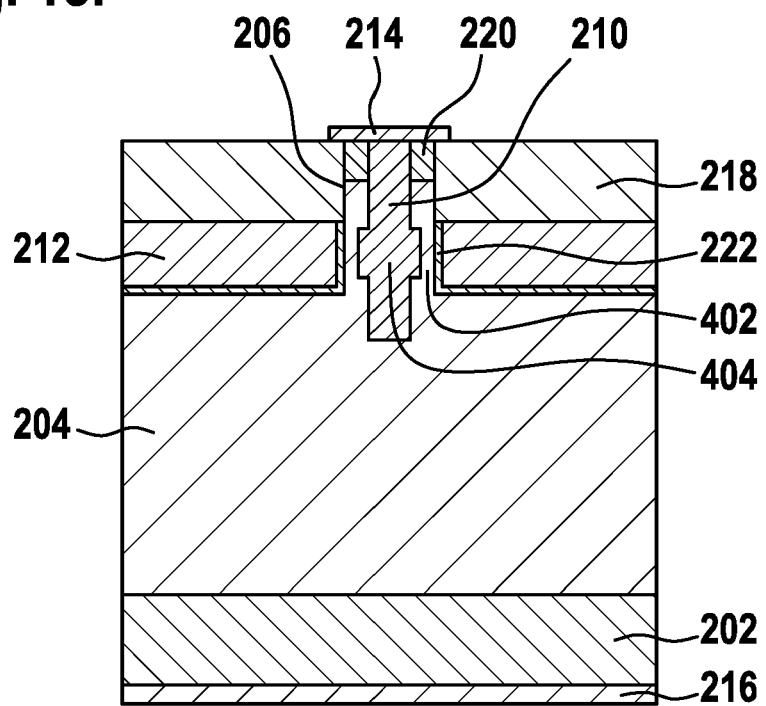

FIG. 11, FIG. 12, and FIG. 13A through FIG. 13F show schematic sectional representations of a vertical field-effect transistor during the formation thereof, according to various specific embodiments. Limiting structure 210 can be formed by an ion implantation after the provision of the semiconductor fin geometry. Here, for example the profile shown in FIG. 11 can be achieved through a strong angle of incidence of the ions to be implanted. Here a mask 1120 is formed on the surface of drift region 204 and of semiconductor fin 208, a part of semiconductor fin 208 being exposed. The exposed parts of semiconductor fin 208 are irradiated with ion beams 1110 in order to form limiting structure 210. Through a rotation of substrate 202 during the implantation, as illustrated for example in FIG. 12, different sides of semiconductor fin 206 can be for example p-doped in order to form limiting structure 210. Alternatively, the implantation of the ions can also take place before a formation of the semiconductor fin. In this case, the semiconductor fin can for example be formed after p-implantation, by removing a part of the p-doped region. Alternative specific embodiments relate to the shape of limiting structure 210, for example of p-doped limiting structure 210. Thus, this structure can also be formed centrically in the semiconductor fin; see FIG. 4. This makes it possible to avoid narrow webs, which are technically difficult to manufacture. The lower end of limiting structure 210 can be situated higher, or also lower, or also at the same height, as the base of the semiconductor fin. In addition, limiting structure 210 can be shown having different width over the depth, as is shown in FIG. 4 and FIG. 13A through FIG. 13F. Through the different widths of limiting structure 210, the breakdown resistance can be reduced in the regions having a larger distance between limiting structure 210 and the semiconductor fin side wall, while a stronger depletion is achieved in the regions having a smaller distance (parallel to the gate dielectric). In FIG. 13A—FIG. 13F, a specific embodiment is shown of a method for forming the structure shown in FIG. 4. The method includes a structuring of semiconductor fin 208 in an n-doped drift region 204 (FIG. 13A). The forming of limiting structure 210 includes an ion implantation of a first p-doping region (FIG. 13B) and an ion implantation of a second p-doping region (FIG. 13C) in order to form the narrowed region 402 illustrated in FIG. 4. In addition, the method can include an ion implantation of the n+ connecting region 224 source electrode 214. In addition, the method includes a depositing and structuring of the gate dielectric, of gate electrode 212, and of insulation 218. In addition, the method can include a deposition and structuring of source electrode 214 and of drain electrode 216. This has the advantage that the critical dimension of the width of semiconductor fin 208 is for example defined by the vertical extension of n-doped layer 208, which can be controlled more precisely by epitaxy or implantation. The conductive region of the semiconductor fin can, but does not have to be, doped in the same way as drift region 204. In other words: the conductive region of the fin can have the same, or a different, doping concentration than does the drift region. Limiting structure 210 can be contacted via source electrode 214 or via a supercell (not shown). Optionally, a higher n-doped region 808 can be provided for current spreading (see FIG. 8 and FIG. 9). In a specific embodiment, the boundary surface between the semiconductor material (e.g., SiC) of the fin and the gate dielectric (e.g., gate oxide) is neutralized, for example by partly canceling the n-doping of the semiconductor material (e.g., SiC). This can be realized for example through counter-implantation, or alternatively through dead implantation with an electrically inactive ion species (e.g. argon). Through this implantation, the conductive channel is away from the semiconductor/dielectric boundary surface towards the boundary surface of the neutralized semiconductor/non-neutralized semiconductor (e.g., neutral SiC/n-SiC boundary surface). If this boundary surface has a low defect density, this increases the channel mobility. If the neutral area is produced by implantation, an implantation can take place before the forming of the semiconductor fin. In a subsequent process, in this case the neutral region can be partly removed and semiconductor fin 208 can be formed. The lateral distance and the ratio of the dopings of the conductive region and limiting structure can determine the shape of the conductive region of the semiconductor fin. Through a suitable choice, a forming of the conductive channel can in this way be laid from the boundary surface of drift region 204 to the gate dielectric into the interior of the semiconductor fin, thus bringing about a higher channel mobility. Alternatively, the neutral region 502—analogously to the production of p-doped region 210—can take place after the provision of the semiconductor fin geometry. In a further specific embodiment, instead of a semiconductor fin, a structure limited in both lateral directions is formed, such as a square or hexagonal structure. A p-doped region as limiting structure can be provided at one or more boundary surfaces, for example via directed implantation (see also FIG. 6 and FIG. 7).

The specific embodiments that have been described and shown in the Figures have been selected only as examples. Different specific embodiments can be combined with one another in their entirety or with regard to individual features. A specific embodiment can also be supplemented with features of another specific embodiment. In addition, described method steps can be repeated, or may be carried out in a sequence differing from that described. In particular, the present invention is not limited to the indicated method.

What is claimed is:

1. A vertical field-effect transistor, comprising:
a drift region having a first conductivity type;
a semiconductor fin on or over the drift region;
a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being configured to limit a conductive channel of the vertical field-effect transistor in the semiconductor fin to an area of the electrically conductive region, and
a gate electrode, wherein the limiting structure has an area, situated in the drift region, that extends laterally in a direction of the gate electrode.

2. A vertical field-effect transistor, comprising:
a drift region having a first conductivity type;
a semiconductor fin on or over the drift region; and
a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being configured to limit a conductive channel of the vertical field-effect transistor in the semiconductor fin to an area of the electrically conductive region,
wherein the limiting structure extend into the drift region.

3. The vertical field-effect transistor as recited in claim 1, wherein the limiting structure has a second conductivity type that is opposite to the first conductivity type.

4. The vertical field-effect transistor as recited in claim 1, wherein the limiting structure is electrically non-conductive.

5. A vertical field-effect transistor, comprising:
a drift region having a first conductivity type;
a semiconductor fin on or over the drift region; and
a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being configured to limit a conductive channel of the vertical field-effect transistor in the semiconductor fin to an area of the electrically conductive region,
wherein the gate electrode is formed next to at least one side wall of the semiconductor fin,
wherein the limiting structure has an area, situated in the drift region, that extends laterally in a direction of the gate electrode.

6. The vertical field-effect transistor as recited in claim 5, wherein the limiting structure has, in a first segment that is situated laterally next to the gate electrode, a larger lateral extension than in a second segment, so that the electrically conductive region in a region of the semiconductor fin corresponds to the first segment of the limiting structure has a narrowed segment.

7. The vertical field-effect transistor as recited in claim 1, wherein the drift region is n-conductive, and the limiting structure has at least one p-conductive region.

8. The vertical field-effect transistor as recited in claim 1, wherein the limiting structure is completely laterally surrounded by the electrically conductive region.

9. A vertical field-effect transistor, comprising:
a drift region having a first conductivity type;
a semiconductor fin on or over the drift region; and
a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being configured to limit a conductive channel of the vertical field-effect transistor in the semiconductor fin to an area of the electrically conductive region,
wherein the limiting structure and the electrically conductive region are formed in coaxial fashion.

10. The vertical field-effect transistor as recited in claim 1, wherein the limiting structure is formed on at least one side wall of the semiconductor fin.

11. A method for forming a vertical field-effect transistor, the method comprising:
forming a drift region having a first conductivity type;
forming a semiconductor fin on or over the drift region;

forming a source/drain electrode on or over the semiconductor fin, the semiconductor fin having an electrically conductive region that connects the source/drain electrode to the drift region in electrically conductive fashion, and having a limiting structure that is formed laterally next to the electrically conductive region and that extends from the source/drain electrode to the drift region, the limiting structure being configured to limit a conductive channel of the vertical field-effect transistor in the semiconductor fin to an area of the electrically conductive region, and forming a gate electrode, wherein the limiting structure has an area, situated in the drift region, that extends laterally in a direction of the gate electrode.

* * * * *